(12) United States Patent
Broxton et al.

(10) Patent No.: US 9,459,527 B1
(45) Date of Patent: Oct. 4, 2016

(54) SEARCH CONTROL FOR SEARCHING VIDEO CONTENT

(75) Inventors: Thomas J. Broxton, San Francisco, CA (US); Baljeet Singh, San Francisco, CA (US); Phuong B. Le, Belmont, CA (US); Olivier De Wolf, Zurich (CH); Alexander Jan Verhage, Oakland, CA (US); Jonathan Goldman, San Francisco, CA (US)

(73) Assignee: GOOGLE INC., Mountain View, CA (US)

( * ) Notice: Subject to any disclaimer, the term of this patent is extended or adjusted under 35 U.S.C. 154(b) by 979 days.

(21) Appl. No.: 13/242,726

(22) Filed: Sep. 23, 2011

(51) Int. Cl.
```
G03F 7/038      (2006.01)
G03F 7/00       (2006.01)
H05K 1/09       (2006.01)
G03F 7/004      (2006.01)
```

(52) U.S. Cl.
CPC ............. G03F 7/038 (2013.01); G03F 7/0007 (2013.01); *G03F 7/0047* (2013.01); *H05K 1/092* (2013.01)

(58) Field of Classification Search
USPC .......................................................... 725/32
See application file for complete search history.

(56) References Cited

U.S. PATENT DOCUMENTS

| | | | |
|---|---|---|---|
| 8,375,208 B2 * | 2/2013 | Darapu | H04N 21/25816 709/250 |
| 2008/0271080 A1 * | 10/2008 | Gossweiler | G06F 3/0486 725/47 |
| 2009/0112715 A1 * | 4/2009 | Steelberg | G06Q 30/02 705/14.65 |
| 2010/0333137 A1 * | 12/2010 | Hamano | H04H 60/46 725/39 |

* cited by examiner

*Primary Examiner* — John Schnurr
*Assistant Examiner* — Christine Kurien
(74) *Attorney, Agent, or Firm* — Lowenstein Sandler LLP

(57) ABSTRACT

Methods, systems, and apparatus, including computer program products, for providing efficient searching of video content. In one aspect, a method includes providing a search control associated with video content items, the search control for receiving search queries for identifying video content items associated with one or more channels in a video sharing environment. A search query is received from a user logged into one of the video sharing environment or a content distribution system. One or more matching video content items are located from the repository based on the search query. A selection of one or more of the video content items is received. A channel associated with the selected video content items is determined. Providing the search control further includes providing a pre-populated suggestion list for selecting a filter criteria for locating a video content item based on the stored historical channel selections associated with the user.

7 Claims, 6 Drawing Sheets

FIG. 2B

Select a video

Search by: ○ Channel  ● Video URL *202*

VideoSearcher channels: [All of VideoSearcher ▼] — *204*

Enter a VideoSearcher channel name:
*208* — [WebSearcher] [Go] [X]

Please enter a VideoSearcher channel name or user name (e.g. yourChannel) to see videos from that channel.

+ Search for videos within channels

| Video | Channel | Title | Description | Duration | Views | Date Uploaded | Preview |
|---|---|---|---|---|---|---|---|

Show rows: [30]  [◄ ►]  1 – 0 of 0

FIG. 2C

Select a video

Search by: ○ Channel ● Video URL

Find video by URL: [http://www.videosearcher.com/watch?v=QP5sz] [Go] — 220

Video for "http://www.videosearcher.com/watch?v=QP5szEn2dxs"

| Video | Channel | Title | Description | Duration | Views | Date Uploaded | Preview |
|---|---|---|---|---|---|---|---|
| ☐☐☐☐ | WebSearcher | WebSearcher News Badges | With WebSearcher News badges, you can keep track of what you're reading, create a more personalized exper... | 1:10 | 54,539 | Jul 13, 2011 | Preview |

Show rows: [30 ▾]   1 - 1 of 1

200

SEARCH CONTROL FOR SEARCHING VIDEO CONTENT

TECHNICAL FIELD

This disclosure relates to information presentation.

BACKGROUND

Video sharing websites may allow users to upload video content to a server for publication on the video sharing website. Users of the video sharing website may view videos uploaded by other users or upload their own videos to share with other users. In some instances, videos uploaded by a particular user may be grouped into a channel associated with the particular user, and other users may search for or browse videos in the channel. Specific users or videos may also be associated with a video advertisement such that when a user selects a video for viewing, the video advertisement associated with the particular user or the video is also automatically played before the selected video is played. Video advertisements may also be displayed based on association with other content on a page. The video sharing website may present video advertisements in a number of different ways, such as presenting the video advertisement as a static image with lines of text on a page or a as a static image with lines of text hovering over a selected video, as well as presenting video advertisements on pages other than the page where an associated video is playing. An advertiser may choose a specific video to which the advertiser attaches or otherwise associates a video advertisement. For example, the advertiser's video advertisement may be related to a particular type of product, and the advertiser may attach the video advertisement to a video likely to be viewed by users within a certain demographic that are also likely to purchase products of that particular type.

SUMMARY

In general, one aspect of the subject matter described in this specification can be embodied in methods that include the actions of providing a search control associated with video content items, the search control for receiving search queries for identifying video content items in a repository of video content items where each video content item is associated with one or more channels in a video sharing environment. A search query is received from a user that is logged into one of the video sharing environment or a content distribution system. One or more matching video content items are located from the repository based on the search query. A selection of one or more of the video content items is received. A channel associated with the selected video content items is determined. Providing the search control further includes providing a pre-populated suggestion list for selecting a filter criteria for locating a video content item based on the stored historical channel selections associated with the user.

These and other embodiments can optionally include one or more of the following features. The user can be logged into the content distribution system and the user can be presented with the search control so as to enable selection of the video content item for inclusion in a campaign associated with the user. Providing a pre-populated suggestion list can further include providing a control for selecting or deselecting one or more of the stored historical channel selections. The method can include providing a textual input control for receiving a query from a user, the query being applied to channels selected by the user for locating the video content item. The method can include automatically populating an input field associated with the textual input control with a prior search query received from the user or an identifier of one of the stored historical channel selections. The channels selected can be selected from the pre-populated selection list by the user. The channels selected can be those that have not been deselected by the user from the pre-populated selection list. The method can include identifying the user based on log-in information associated with one of the content delivery system or the video sharing environment. Each of the one or more channels can be associated with video content items uploaded by a particular user of the video sharing environment.

Other embodiments of this aspect include corresponding systems, apparatus, and computer program products, configured to perform the actions of the methods, encoded on computer storage devices.

Potential advantages may include reducing the amount of time a user spends searching for shared videos to associate with advertisements. The user's previous video selections or searches may be used to determine suggested videos for subsequent association with advertisements. Search control options may be provided to the user to filter search results for videos that may be more relevant. Accordingly, the user may be presented with relevant videos or options to search for relevant videos to associate with an advertisement video.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification describes technologies relating to providing efficient searching of video content. A video advertisement may be played in connection with a selected video on a video sharing website, a particular user of the video sharing website, or specific content associated with the video sharing website. A selected video may include any shared video uploaded by a user of the video sharing website, for example. A potential advertiser may select a particular shared video, user, or other content to be associated with a particular video advertisement. The following examples describe the selection of a particular shared video to associate with a video advertisements, but the association of video advertisements with a particular user of the video sharing website or specific content on the video sharing website is also within the scope of the present disclosure. In some implementations, an interface is presented to allow potential advertisers to submit queries to search for relevant shared videos based on search terms. In some instances, shared videos may be grouped into a particular channel on the video sharing website, where each channel may include videos uploaded by a particular user. The interface may also allow a user to view different channels by entering the name of a particular channel.

Advertisers may search for shared videos on the video sharing website more than once. In certain implementations, a channel associated with an advertiser's previously selected video may be saved so that videos in the saved channel may be automatically presented to the user as suggested videos for the advertiser to select in a subsequent search. A search control may be presented to the advertiser to allow the advertiser to search for videos within a saved channel or to view a list of videos in the saved channel. The search control may also provide options allowing the user to choose from a plurality of saved channels for searching or viewing of potential videos to include in an advertising campaign. Searches may be performed using search terms or video identifiers, for example. Accordingly, the search control may allow an advertiser to search for specific channels or videos across the entire video sharing website or for videos within a particular channel such as a saved channel.

Figure 1:
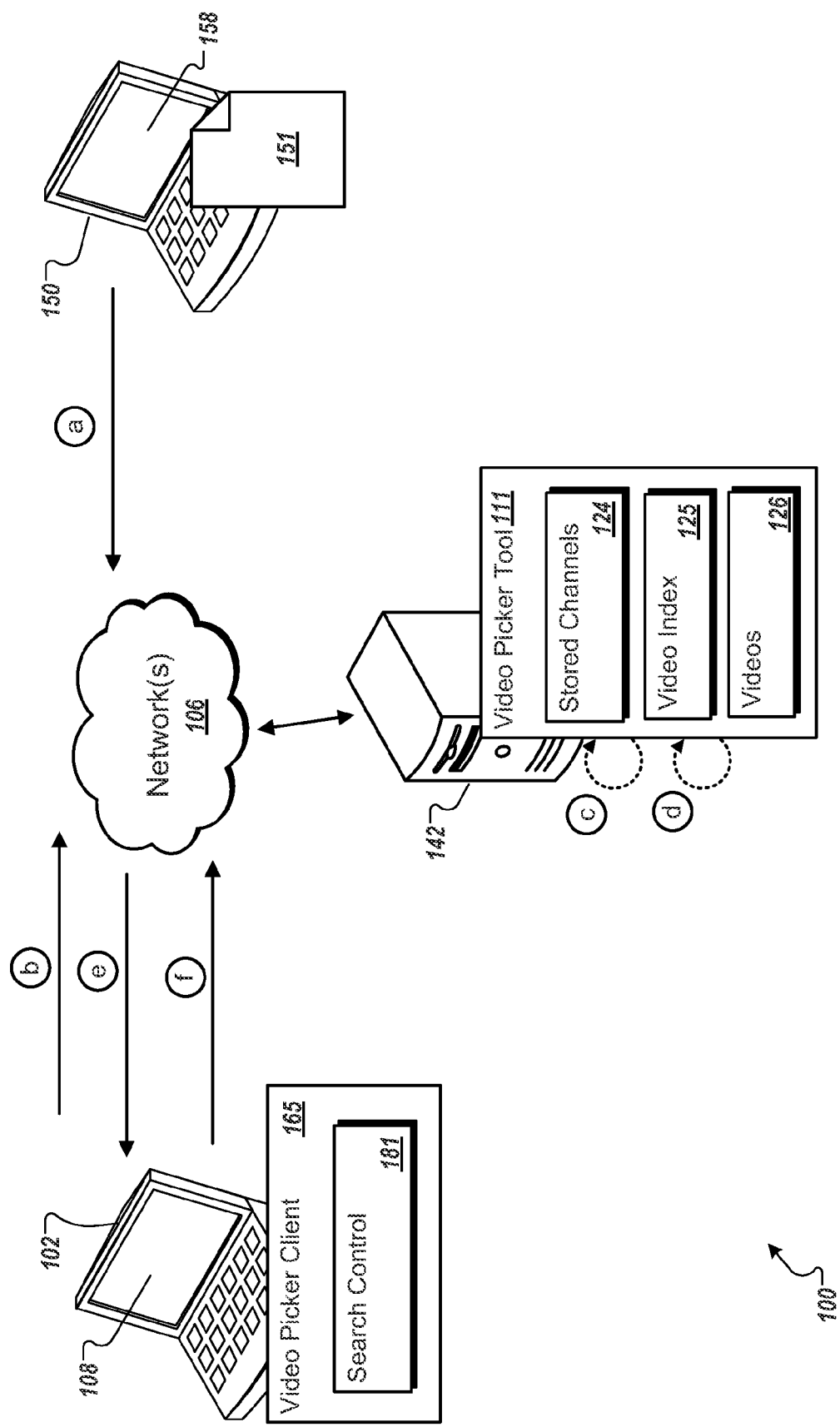
FIG. 1 is a block diagram of an example system that provides a search control for searching video content.

FIG. 1 is a block diagram illustrating an example architecture for a system 100 that provides search options for video content stored in a repository. The system 100 includes computing devices 102 and 150, which may each include a processing system that may be accessed by a user interacting directly with the computing device 102 or 150 through a graphical user interface (GUI) 108 or 158. In some instances, any appropriate computing system can be used in place of the computing devices 102 or 150, including a mobile device, personal computer, laptop, PDA, smartphone, tablet, or other processing device. The computing devices 102 and 150 each include a processor that can execute programs, perform data manipulations, and control tasks in the computing devices 102 and 150. The processor can execute programs and computer applications such as a video picker client 165. In some instances, the computer applications can include a web browser or other application configured to present an interface to a user for searching for video content associated with a video sharing environment or a content distribution system to include in an advertising campaign.

In some implementations, the video picker client 165 presents an interface with a search control module 181 to a user of computing device 102. The search control module 181 may allow the user to search for video files to include in an advertisement campaign, and the user may select one of the video files to associate with an advertisement video. The video files may be remotely stored at a server 142 and provided to the computing device 102 across a network 106, or the video files may be stored locally at the computing device 102. In some instances, the video picker client 165 is executed on the remote server 142 and provided as a hosted service to a user of computing device 102. Alternatively, the video picker client 165 may also be stored and executed locally at the computing device 102.

Although the video picker tool 111 is illustrated as an individual module at server 142, the video picker tool 111 can also be implemented as a sub-module within the video picker client 165 or as any application, widget, embedded application, sub-module, third party service, process, component, library, and the like, configured to perform the features described herein. In some implementations, the video picker tool 111 may be configured to index video files 126 stored in a database based on the identity of the user who uploaded a video. For example, a user of computing device 150 may upload a video to server 142 to share with other users of a video sharing website or content distribution system. Videos uploaded by the same user may be indexed as belonging to a particular channel, for example. In other implementations, the video picker tool 111 may be configured to access indexed video files 126 that may be previously indexed by another module or application.

The video picker tool 111 can monitor the videos selected, viewed, or searched by a user to determine context-based search options to present to the user for future searches. For example, a user may select a particular video to include in an advertising campaign. The video picker tool 111 may store the channel associated with the selected video as a stored channel 124. Other videos in the stored channel 124 may then be automatically presented to the user as suggested videos to include in an advertising campaign. The one or more stored channels 124 may represent historical channel selections associated with a particular user, such as channels containing videos previously selected by the user. The video picker tool 111 may present other options to the user based on the stored channels 124 associated with the user. Further, the stored channels 124, video index 125, or videos 126 may be stored at the server 142, at the computing device 102, or across a plurality of servers in a distributed environment, for example. In some implementations, the videos 126 (and/or the video index 125 and stored channels 124) may be stored remotely with respect to the video picker tool 111.

FIG. 1 depicts a flow of data during various states among computing device 102/150 and server 142, when an example process for providing video search options is performed by the system 100. The states (a) to (f) may occur in the illustrated sequence, or they may occur in a sequence that is different than the illustrated sequence.

First, as shown in state (a), a user of computing device 150, also known as the "uploader," may upload a video 151 to share with other users on a video sharing website. The video sharing website may be a website allowing users to share videos or other media content with other users of the website. The shared video 151 may be stored with other videos 126 at one or more servers hosted by the video sharing website, where a video picker tool 111 (or other tool) may identify the uploader of the shared video 151 and index the video 151 accordingly in a video index 125. In some implementations, the videos 126 are indexed based on the uploader of the video, where videos uploaded by the same user are included in a same channel. Users of the video sharing website may browse videos in a particular channel or search for certain channels on the video sharing website.

A user of computing device 102, or "advertiser," may want to associate an advertisement video with the shared video 151. In some implementations, the advertisement video associated with a particular video is automatically played prior to, after or during presentation of the particular video on the video sharing website. Accordingly, at state (b), the advertiser sends a request using the video picker client 165 to the video picker tool 111 at server 142 to select shared video 151 as the video that will be associated with the advertiser's advertisement video. In some implementations, the advertiser may upload the advertisement video concurrently with the request. The video picker tool 111 may associate the advertisement video with the shared video 151. In some implementations, the video picker tool 111 also stores the channel associated with the shared video 151 as a stored channel 124 for the advertiser at state (c). In the illustrated example, the channel stored by the video picker tool 111 is the channel associated with the uploader of the shared video 151. As a result, each advertiser using the video picker client may be associated with a set of stored channels.

Figure 2:
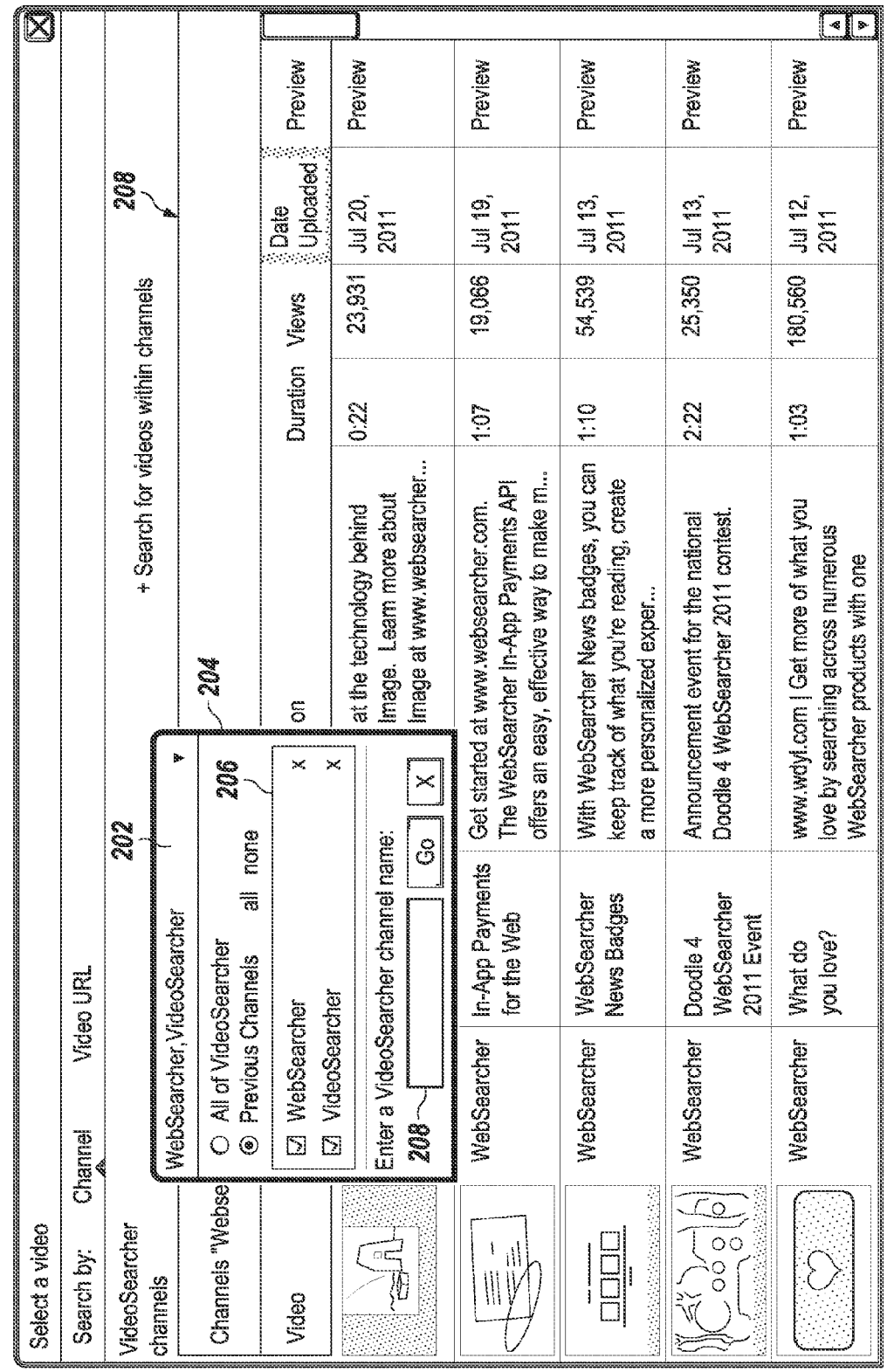
FIGS. 2A-2C are example diagrams of user interfaces presented to a user.

At state (d), the video picker tool 111 may determine that the advertiser has initiated a new search for additional shared videos to associate with advertisement videos. For example, the video picker tool 111 may detect that the advertiser has logged into an account for advertisers on the video sharing website or that the advertiser has selected an option for searching shared videos using the search control 181. In some instances, the search control 181 is automatically presented to the advertiser after the advertiser logs into an account on the video sharing website. The search control 181 may include a stateful control for selecting video content items from a repository of video content items. In response to the determination that the advertiser has initiated a search for additional shared videos, the video picker tool 111 may send search options to the video picker client 165 for presentation to the advertiser at state (e). The search options may include a pre-populated suggestion list of the stored channels 124 associated with the advertiser or a list of individual videos in the stored channels 124, for example. The pre-populated suggestion list of stored channels 124 may include options allowing the advertiser to select filter criteria for locating additional video content based on the stored historical channel selections associated with the advertiser. For example, the search options presented to the advertiser may allow the advertiser to filter search results such that only videos within the stored channel associated with the shared video 151 are displayed. The various search options that may be presented to the advertiser through the search control 181 are described in further detail with respect to FIG. 2.

In some implementations, the search options presented to the advertiser are based on stored channels 124 associated with the shared video 151 previously selected by the advertiser (during state (b)). Accordingly, the advertiser may be presented with suggestions for shared videos to select for attaching/associating advertisement videos based on the advertiser's previous selections. The suggested videos may help the advertiser identify relevant videos while minimizing the time required to search for additional videos. At state (f), the advertiser may then submit a query to search for videos within one or more of the stored channels 124 presented to the advertiser or to select one of the shared videos in the stored channels 124 to associate with an advertisement video. The video picker tool 111 may identify and present video content items responsive to the query received from the advertiser.

FIG. 2A illustrates an example interface 200 of the search control 181 with various search options presented to an advertiser by the video picker client 165. The interface 200 may include a text field 202 for receiving search terms from an advertiser. For example, the advertiser may enter key words into text field 202 to search for shared videos on the video sharing website to associate with advertisement videos or to search for particular channels to browse shared videos within those channels. In some implementations, the text field 202 may be automatically populated with a prior search query received from the advertiser or with the name of one or more stored channels 124 associated with the advertiser. In some implementations, the text field 202 includes an interactive menu 204 with additional search options. In the illustrated example, the interactive menu 204 includes options related to suggested channels available for the advertiser to search. For example, the interactive menu 204 may include a list of stored channels 124 associated with the advertiser, with each of the stored channels 124 representing a channel containing at least one shared video previously selected by the advertiser.

Further, the interactive menu 204 may include options allowing the advertiser to customize searches related to the stored channels 124, such as allowing the advertiser to select or deselect specific stored channels to search. In some implementations, the interactive menu 204 includes options to select all or none of the stored channels presented to the advertiser, or text fields 208 to enter a specific channel name to search. The interactive menu 204 may also include options allowing the advertiser to conduct searches without limitation to a particular channel, such as options for searching the entire domain of the video sharing website.

The interface 200 may also include a video display list 208 presenting the shared videos returned from a particular search. The video display list 208 may also be used to present a pre-populated list of suggested shared videos as determined by the video picker tool 111 as potential shared videos to be used in an advertising campaign based on the stored channels 124 associated with the advertiser or on other context data derived from the advertiser's previous searches. For example, the video picker tool 111 may automatically identify at least some shared videos from the advertiser's stored channels for display in response to the advertiser's activation of the interface 200. The search control 181 may automatically update the video display list 208 in response to selection or de-selection of specific stored channels displayed in the interactive menu 204. For example, an advertiser's selection of one of the stored channels 124 presented in the interactive menu 204 may automatically populate the video display list 208 with shared videos associated with the selected channel, while de-selection of the channel may automatically filter out the shared videos associated with the same channel. As illustrated in FIG. 2A, the video display list 208 may include detailed information associated with each shared video, such as a name, description, duration, number of views, or date uploaded for a shared video.

FIG. 2B illustrates other search options that may be presented to the advertiser through the search interface 200 associated with the search control 181. As seen in FIG. 2B, the advertiser may be given the option to search the entire video sharing website domain or to search for specific channels on the video sharing website by channel name. Further, the search interface 200 may provide an option allowing the advertiser to search for shared videos by entering the identifier of a specific shared video, as illustrated in FIG. 2C. In some instances, the identifier may be a uniform resource locator (URL) string. As depicted in FIG. 2C, an input text field 220 may be presented in the interface to allow an advertiser to search for shared videos matching the URL string entered into the input text field 220.

Figure 3:
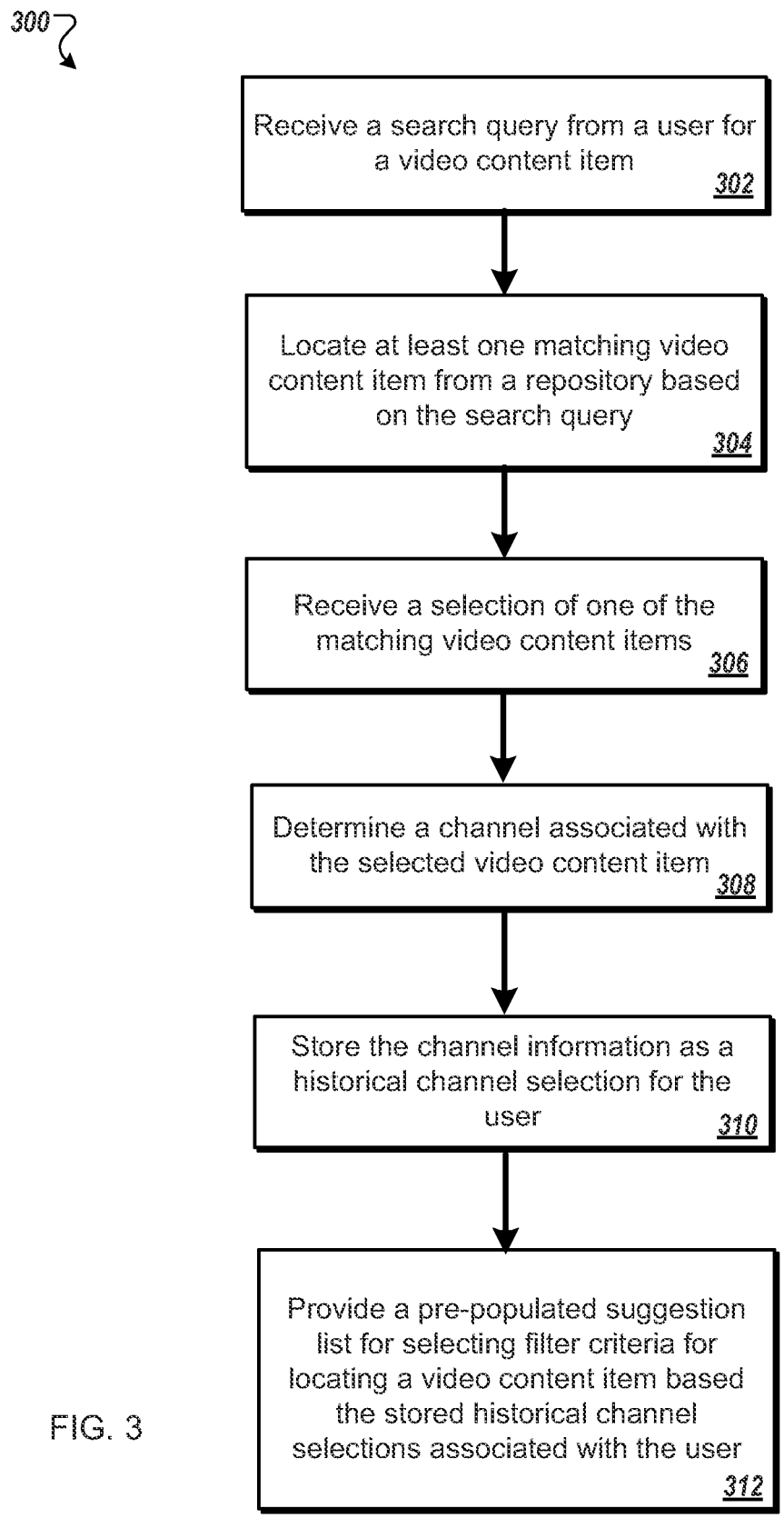
FIG. 3 is a flowchart of an example process for providing a search control for searching video content.

FIG. 3 illustrates an example process 300 for providing search options for video content items. A search query is received from a user for a video content item in a repository of video content items at 302. Each video content item may be associated with one or more channels in a video sharing environment. At least one matching video content item is located from a repository of video content items at 304 based on the search query. A selection of one of the matching video content items is received at 306. A channel associated with the selected video content item is determined at 308. The channel information is stored as a historical channel selection for the user at 310. A pre-populated suggestion list for selecting filter criteria for locating a video content item is provided at 312 based on the stored historical channel selections associated with the user.

Figure 4:
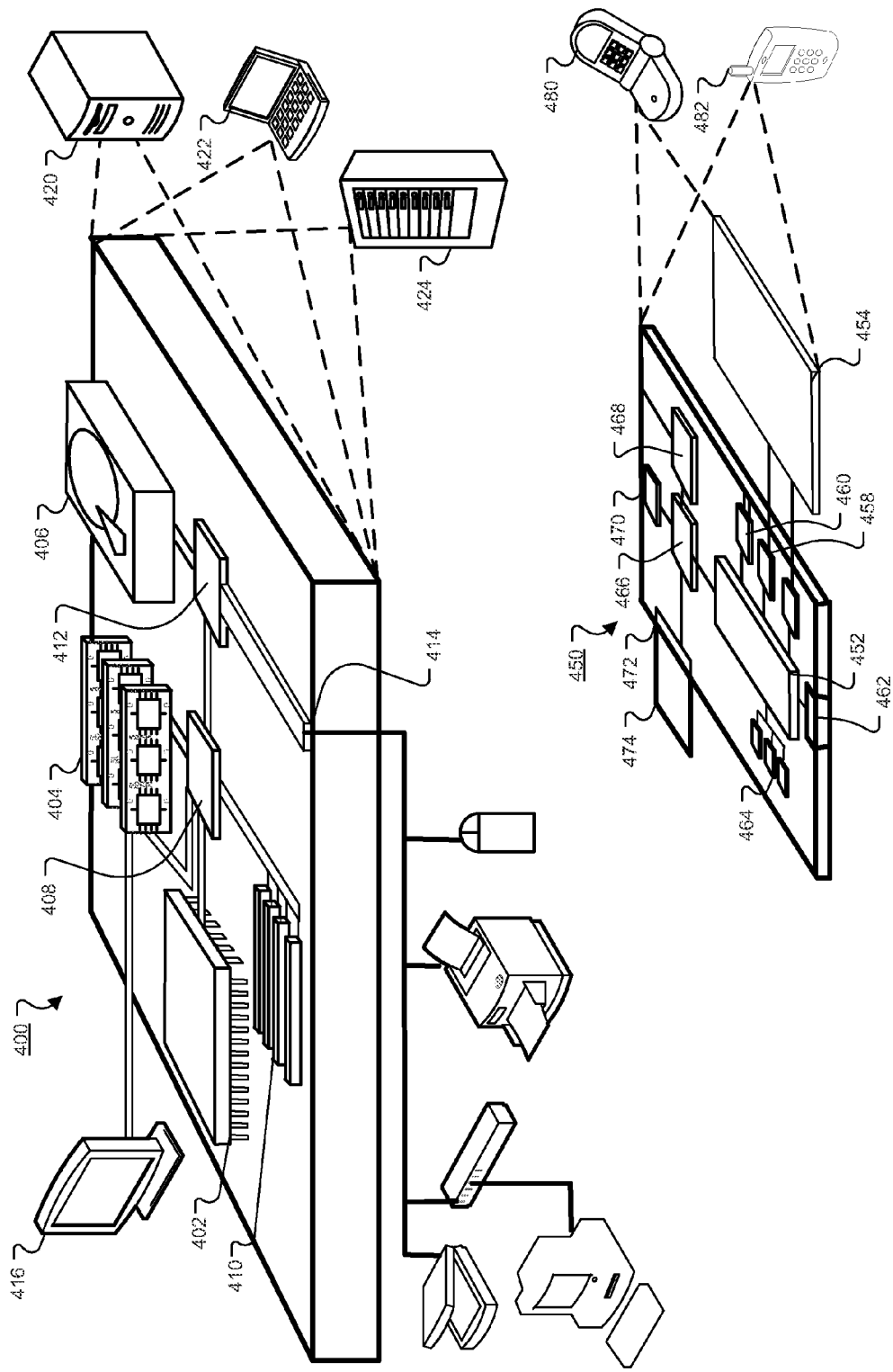
FIG. 4 shows an example of a computer device and a mobile computing device that can be used to implement the processes described herein.

FIG. 4 shows an example of a generic computing device 400 and a generic mobile computer device 450, both which may be used in the process described herein for providing efficient searching for video content. For example, computing device 400 may perform the functions of server 142, computing device 150, or computing device 102, or mobile computer device 450 may perform the function of computing devices 150 or 102. Computing device 400 is intended to represent various forms of digital computers, such as laptops, desktops, workstations, personal digital assistants, servers, blade servers, mainframes, and other appropriate computers. Computing device 450 is intended to represent various forms of mobile devices, such as personal digital assistants, cellular telephones, smartphones, and other similar computing devices. The components shown here, their connections and relationships, and their functions, are meant to be exemplary only, and are not meant to limit implementations described and/or claimed in this document.

Computing device 400 includes a processor 402, memory 404, a storage device 406, a high-speed interface 408 connecting to memory 404 and high-speed expansion ports 410, and a low speed interface 412 connecting to low speed bus 414 and storage device 406. Each of the components 402, 404, 406, 408, 410, and 412, are interconnected using various busses, and may be mounted on a common motherboard or in other manners as appropriate. The processor 402 can process instructions for execution in the computing device 400, including instructions stored in the memory 404 or on the storage device 406 to display graphical information for a GUI on an external input/output device, such as display 416 coupled to high speed interface 408. In other implementations, multiple processors and/or multiple buses may be used, as appropriate, along with multiple memories and types of memory. Also, multiple computing devices 400 may be connected, with each device providing portions of the necessary operations (e.g., as a server bank, a group of blade servers, or a multi-processor system).

The memory 404 stores information in the computing device 400. In one implementation, the memory 404 is a volatile memory unit or units. In another implementation, the memory 404 is a non-volatile memory unit or units. The memory 404 may also be another form of computer-readable medium, such as a magnetic or optical disk.

The storage device 406 is capable of providing mass storage for the computing device 400. In one implementation, the storage device 406 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier may be a computer- or machine-readable medium, such as the memory 404, the storage device 406, memory on processor 402, or a propagated signal. For example, the information carrier may be a non-transitory, machine-readable storage medium.

The high speed controller 408 manages bandwidth-intensive operations for the computing device 400, while the low speed controller 412 manages lower bandwidth-intensive operations. Such allocation of functions is exemplary only. In one implementation, the high-speed controller 408 is coupled to memory 404, display 416 (e.g., through a graphics processor or accelerator), and to high-speed expansion ports 410, which may accept various expansion cards (not shown). In the implementation, low-speed controller 412 is coupled to storage device 406 and low-speed expansion port 414. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 400 may be implemented in a number of different forms, as shown in the figure. For example, it may be implemented as a standard server 420, or multiple times in a group of such servers. It may also be implemented as part of a rack server system 424. In addition, it may be implemented in a personal computer such as a laptop computer 422. Alternatively, components from computing device 400 may be combined with other components in a mobile device (not shown), such as device 450. Each of such devices may contain one or more of computing device 400, 450, and an entire system may be made up of multiple computing devices 400, 450 communicating with each other.

Computing device 450 includes a processor 452, memory 464, an input/output device such as a display 454, a communication interface 466, and a transceiver 468, among other components. The device 450 may also be provided with a storage device, such as a micro-drive or other device, to provide additional storage. Each of the components 450, 452, 464, 454, 466, and 468, are interconnected using various buses, and several of the components may be mounted on a common motherboard or in other manners as appropriate.

The processor 452 can execute instructions in the computing device 450, including instructions stored in the memory 464. The processor may be implemented as a chipset of chips that include separate and multiple analog and digital processors. The processor may provide, for example, for coordination of the other components of the device 450, such as control of user interfaces, applications run by device 450, and wireless communication by device 450.

Processor 452 may communicate with a user through control interface 458 and display interface 456 coupled to a display 454. The display 454 may be, for example, a TFT LCD (Thin-Film-Transistor Liquid Crystal Display) or an OLED (Organic Light Emitting Diode) display, or other appropriate display technology. The display interface 456 may comprise appropriate circuitry for driving the display 454 to present graphical and other information to a user. The control interface 458 may receive commands from a user and convert them for submission to the processor 452. In addition, an external interface 462 may be provided in communication with processor 452, so as to enable near area communication of device 450 with other devices. External interface 462 may provide, for example, for wired communication in some implementations, or for wireless communication in other implementations, and multiple interfaces may also be used.

The memory 464 stores information in the computing device 450. The memory 464 can be implemented as one or more of a computer-readable medium or media, a volatile memory unit or units, or a non-volatile memory unit or units. Expansion memory 464 may also be provided and connected to device 450 through expansion interface 462, which may include, for example, a SIMM (Single In Line Memory Module) card interface. Such expansion memory 464 may provide extra storage space for device 450, or may also store applications or other information for device 450. Specifically, expansion memory 464 may include instructions to carry out or supplement the processes described above, and may include secure information also. Thus, for example, expansion memory 464 may be provide as a security module for device 450, and may be programmed with instructions that permit secure use of device 450. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 464, expansion memory 464, memory on processor 452, or a propagated signal that may be received, for example, over transceiver 468 or external interface 462.

Device 450 may communicate wirelessly through communication interface 466, which may include digital signal processing circuitry where necessary. Communication interface 466 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 468. In addition, short-range communication may occur, such as using a Bluetooth, Wi-Fi, or other such transceiver (not shown). In addition, GPS (Global Positioning System) receiver module 470 may provide additional navigation- and location-related wireless data to device 450, which may be used as appropriate by applications running on device 450.

Device 450 may also communicate audibly using audio codec 460, which may receive spoken information from a user and convert it to usable digital information. Audio codec 460 may likewise generate audible sound for a user, such as through a speaker, e.g., in a handset of device 450. Such sound may include sound from voice telephone calls, may include recorded sound (e.g., voice messages, music files, etc.) and may also include sound generated by applications operating on device 450.

The computing device 450 may be implemented in a number of different forms, as shown in the figure. For example, it may be implemented as a cellular telephone 480. It may also be implemented as part of a smartphone 482, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or topic object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of implementations have been described. Nevertheless, it will be understood that various modifications may be made.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are in the scope of the following claims.

Elements of different implementations described herein may be combined to form other implementations not specifically set forth above. Elements may be left out of the processes, computer programs, Web pages, etc. described herein without adversely affecting their operation. Furthermore, various separate elements may be combined into one or more individual elements to perform the functions described herein.

Other implementations not specifically described herein are also in the scope of the following claims.

What is claimed is:

1. A method performed by at least one processing device, the method comprising:

providing a search control associated with video content items, the search control for receiving search queries for identifying video content items in a repository of video content items where each video content item is associated with one or more channels in a video sharing environment;

receiving a search query from an advertiser that is logged into one of the video sharing environment or a content distribution system;

locating one or more matching video content items from the repository based on the search query;

receiving a selection of one or more of the video content items for inclusion in an advertisement campaign associated with the advertiser; and responsive to receiving the selection of one or more of the video content items for inclusion in the advertisement campaign associated with the advertiser, determining, by the at least one processing device, a channel associated with the selected video content items;

where providing the search control comprises:
identifying a channel associated with one or more video content items that were selected by the advertiser for inclusion in a prior advertisement campaign, and
populating a suggestion list with one or more filter criterion based on the identified channel.

2. The method of claim 1, where the advertiser is logged into the content distribution system and the advertiser is presented with the search control so as to enable selection of the video content item for inclusion in the advertisement campaign associated with the advertiser.

3. The method of claim 1, further comprising providing a control for selecting or deselecting one or more of the stored historical channel selections.

4. The method of claim 1 further comprising providing a textual input control for receiving a query from an advertiser, the query being applied to channels selected by the advertiser for locating the video content item.

5. The method of claim 4 further comprising populating an input field associated with the textual input control with a prior search query received from the advertiser or an identifier of one of the stored historical channel selections.

6. The method of claim 1, further comprising identifying the advertiser based on log-in information associated with one of the content delivery system or the video sharing environment.

7. The method of claim 1, wherein each of the one or more channels is associated with video content items uploaded by a particular advertiser of the video sharing environment.

* * * * *